United States Patent
Yang et al.

(10) Patent No.: US 12,356,546 B2
(45) Date of Patent: Jul. 8, 2025

(54) PRINTED CIRCUIT BOARD

(71) Applicant: SAMSUNG ELECTRO-MECHANICS CO., LTD., Suwon-si (KR)

(72) Inventors: Woo Seok Yang, Suwon-si (KR); Seung Chul Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 223 days.

(21) Appl. No.: 18/124,146

(22) Filed: Mar. 21, 2023

(65) Prior Publication Data

US 2024/0164019 A1  May 16, 2024

(30) Foreign Application Priority Data

Nov. 16, 2022 (KR) .......................... 10-2022-0153851

(51) Int. Cl.
*H05K 1/11* (2006.01)

(52) U.S. Cl.
CPC ..... *H05K 1/113* (2013.01); *H05K 2201/0347* (2013.01); *H05K 2201/09827* (2013.01)

(58) Field of Classification Search
None
See application file for complete search history.

(56) References Cited

U.S. PATENT DOCUMENTS

| | | | |
|---|---|---|---|
| 2013/0286619 A1* | 10/2013 | Endo | H01L 23/49822 174/267 |
| 2014/0353025 A1 | 12/2014 | Jang et al. | |
| 2021/0259106 A1 | 8/2021 | Tachibana | |

FOREIGN PATENT DOCUMENTS

| | | | |
|---|---|---|---|
| JP | 2014192177 A | * | 10/2014 |
| JP | 2021-132068 A | | 9/2021 |
| KR | 10-2014-0146675 A | | 12/2014 |

OTHER PUBLICATIONS

JP 2014192177 A Translation (Year: 2024).*

* cited by examiner

*Primary Examiner* — Hoa C Nguyen
*Assistant Examiner* — John B Freal
(74) *Attorney, Agent, or Firm* — Morgan, Lewis & Bockius LLP

(57) ABSTRACT

The present disclosure relates to a printed circuit board including a first insulating layer, a pad embedded in an upper portion of the first insulating and having an upper surface portion, a side surface portion, and a lower surface portion, where a portion of the upper surface portion and a portion of the side surface portion protrude from the upper surface of the first insulating layer, and a metal layer covering the portion of the upper surface portion, the portion of the side surface portion, and a portion of the lower surface portion of the pad.

20 Claims, 4 Drawing Sheets

PRINTED CIRCUIT BOARD

CROSS-REFERENCE TO RELATED APPLICATION(S)

This application claims benefit of priority to Korean Patent Application No. 10-2022-0153851 filed on Nov. 16, 2022, in the Korean Intellectual Property Office, the disclosure of which is incorporated herein by reference in its entirety.

TECHNICAL FIELD

The present disclosure relates to a printed circuit board.

BACKGROUND

In order to cope with the recent trend of reducing the weight and size of mobile devices, there is an increasing need to implement lightness, thinness, and shortness in printed circuit boards mounted thereon. Meanwhile, as mobile devices become light, thin, and short, research is continuing to improve the reliability of pads for mounting parts in a substrate structure for mounting various parts on a substrate in response to technical demands.

SUMMARY

An aspect of the present disclosure is to provide a printed circuit board that can increase coupling force between a pad and an insulating layer in a printed circuit board for mounting electronic components and chips, etc.

An aspect of the present disclosure is to provide a printed circuit board having excellent signal connectivity.

Another aspect of the various purposes of the present disclosure is to provide a printed circuit board manufacturing method which can improve reliability.

One among the various solutions proposed in the present disclosure is to provide a printed circuit board including a first insulating layer, a pad embedded in an upper portion of the first insulating layer and having an upper surface portion, a side surface portion, and a lower surface portion, where a portion of the upper surface portion and the side surface portion protrudes from the upper surface of the first insulating layer, and a metal layer covering the upper surface portion and side surface portion of the pad and covering a portion of the lower surface portion of the pad.

Another one of the various solutions proposed in the present disclosure is to provide a printed circuit board comprising a first insulation layer, a pad embedded in one side of the first insulating layer, and including one surface exposed from one surface of the first insulating layer and another surface having a concave area, a first circuit disposed on the other surface of the first insulating layer, a first via having a first portion filling the concave area of the other surface of the pad and a second portion penetrating the first insulating layer, wherein at least a portion of the one surface of the first insulating layer is exposed to outside, and on the other surface of the pad, a cross-sectional area of the first portion is larger than that of the second portion.

As one of the various effects of the present disclosure, it is possible to provide a printed circuit board capable of increasing the coupling force between the pad and the insulating layer in a printed circuit board for mounting an electronic component, a chip, or the like.

It is possible to provide a printed circuit board with excellent signal connectivity as a different effect among the various effects of the present disclosure.

It is possible to provide a printed circuit board capable of improving reliability as one of the various effects of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
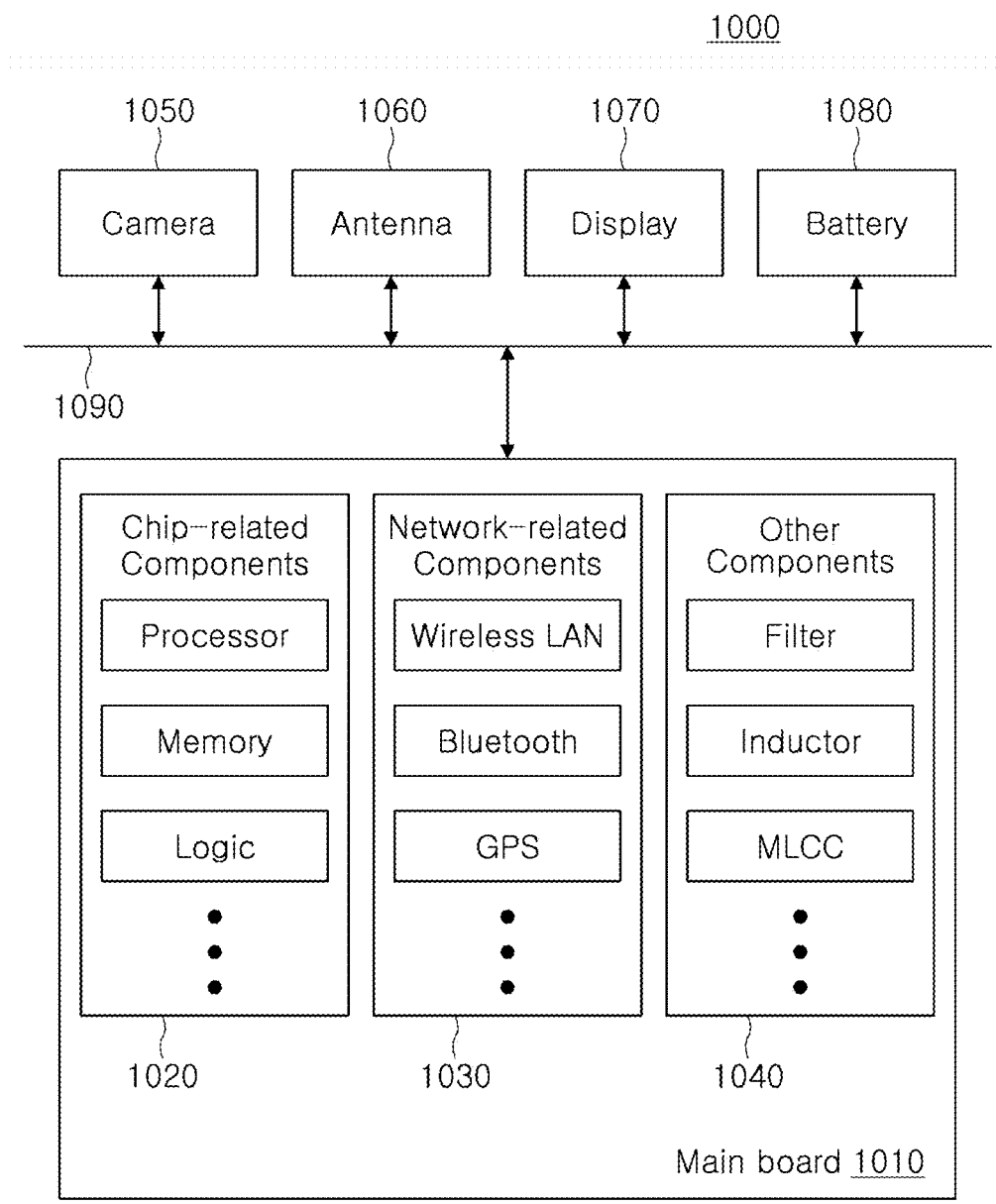
FIG. 1 is a block diagram schematically illustrating one embodiment of an electronic device system.

Hereinafter, the present disclosure will be described with reference to the accompanying drawings. The shape and size of the elements in the drawings may be exaggerated or reduced for clearer description Electronic Device FIG. 1 is a block diagram schematically illustrating an embodiment of a c system.

Referring to the figure, an electronic device 1000 accommodates a mainboard 1010. Chip-related components 1020, network-related components 1030, and other components 1040 are physically and/or electrically connected to the mainboard 1010. These are also combined with other electronic components described below to form various signal lines 1090.

The chip-related components 1020 include memory chips such as volatile memory (e.g., DRAM), non-volatile memory (e.g., ROM), and flash memory, etc.; application processor chips such as central processors (e.g., CPUs), graphics processors (e.g., GPUs), digital signal processors, cryptographic processors, microprocessors, microcontrollers, etc.; logic chips such as analog-to-digital converters and ASIC (application-specific IC), etc., and the present disclosure is not limited thereto, and other chip-related electronic components may also be included. Also, it is natural that these chip-related components 1020 can be combined with each other. The chip-related components 1020 may be in the form of a package containing the chip or electronic component described above.

The network-related components 1030 include Wi-Fi (IEEE 802.11 family, etc.), WiMAX (IEEE 802.16 family, etc.), IEEE 802.20, LTE (long term evolution), EV-DO, HSPA+, HSDPA+, HSUPA+, EDGE, GSM, GPS, GPRS, CDMA, DECT, Bluetooth, 3G, 4G, 5G, and any other wireless and wired protocols designated as subsequent are included, and are not limited thereto, and any of a number of other wireless or wired standards or protocols may also be included. Also, it is natural that the network-related components 1030 can be combined with the chip-related component 1020.

Other components 1040 include high frequency inductors, ferrite inductors, power inductors, ferrite beads, Low Temperature Co-Firing Ceramics (LTCC), Electro Magnetic Interference) (EMI) filter, and Multi-Layer Ceramic Condenser (MLCC). However, the present invention is not limited to these, and can also include passive disclosure in the form of chip components used for various other purposes. Also, of course, other components 1040 may be combined with the chip-related components 1020 and/or the network-related components 1030.

Depending on the type of electronic device 1000, the electronic device 1000 may include other electronic components that may or may not be physically and/or electrically connected to the mainboard 1010. Embodiments of other electronic components include a camera module 1050, an antenna module 1060, a display 1070, and a battery 1080. However, the present disclosure is not limited to this, and may be audio codecs, video codecs, power amplifiers, compasses, accelerometers, gyroscopes, speakers, mass storage devices (for example, hard disk drives), compact disks (CD), digital versatile disks (DVDs), etc. It is natural that other electronic components used for various purposes may also be included depending on the type of electronic device 1000.

The electronic device 1000 may be a smart phone, a personal digital assistant, a digital video camera, a digital still camera, a network system, a computer, a monitor, a tablet, a laptop, a netbook, a television, a video game, a smart watch, and an automotive, etc. However, the present disclosure is not limited to these, and may be any other electronic device that processes data.

Figure 2:
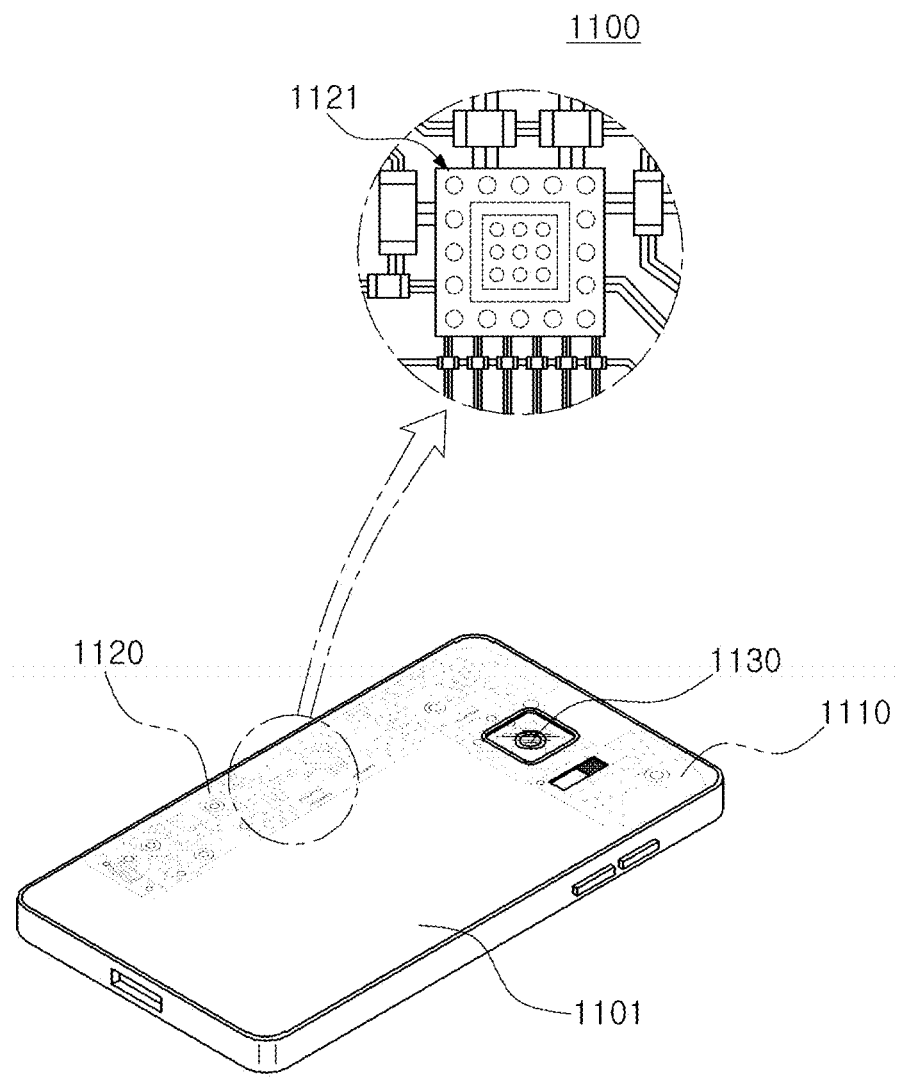
FIG. 2 is a perspective view schematically illustrating one embodiment of an electronic device.

FIG. 2 is a perspective view schematically illustrating one embodiment of the electronic device.

Referring to the figure, the electronic device may be, for example, a smartphone 1100. A motherboard 1110 is received inside the smartphone 1100, and various components 1120 are physically and/or electrically connected to this motherboard 1110. Also, other components that may or may not be physically and/or electrically connected to the mainboard 1110, such as camera module 1130 and/or speaker 1140, are received inside. Some of the components 1120 may be the chip-related components as described above, for example, they may be component package 1121, but the present disclosure is not limited thereto. The component package 1121 may be in the form of a printed circuit board with electronic components including active components and/or passive components disposed as surface mounts. Furthermore, the component package 1121 may be in the form of a printed circuit board in which an active component and/or a passive component are embedded. Meanwhile, the electronic device is not necessarily limited to the smartphone (1100), and may be another electronic device as described above.

Printed Circuit Board

Figure 3:
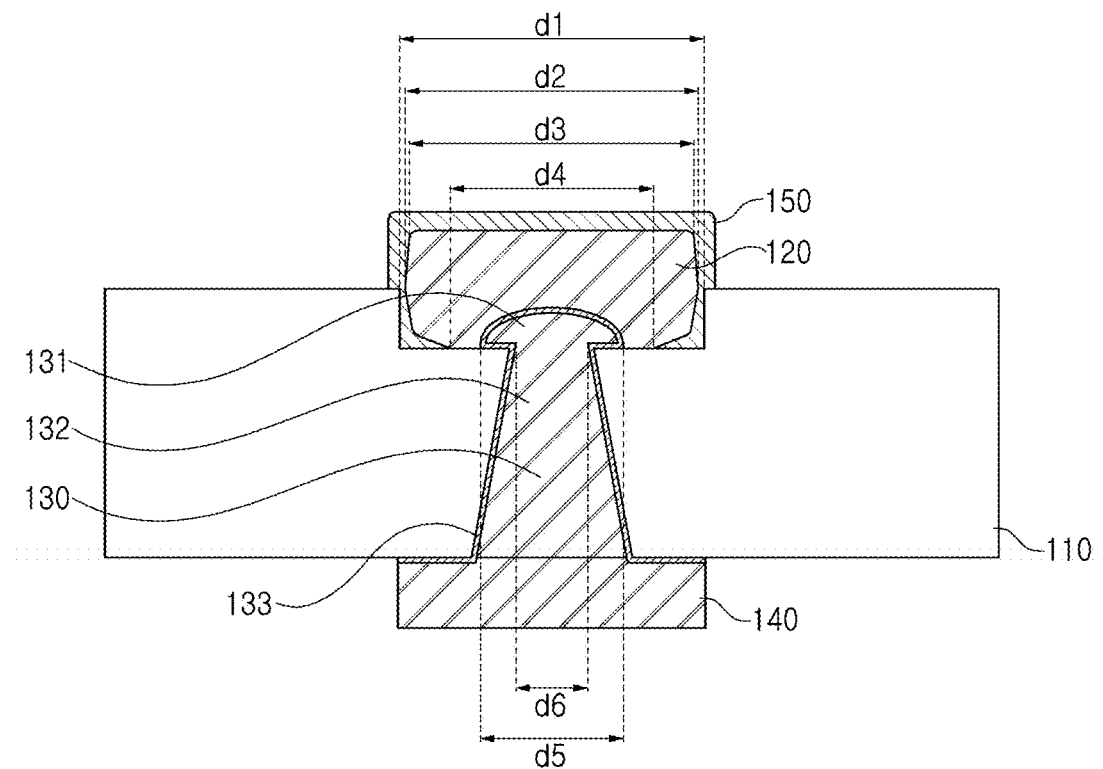
FIG. 3 is a cross-sectional view schematically illustrating a printed circuit board according to one embodiment.

FIG. 3 is a cross-sectional view schematically illustrating a printed circuit board according to one embodiment.

Referring to FIG. 3, the printed circuit board according to one embodiment includes the first insulation layers 110, the pad 120 embedded in one surface side of the first insulating layer 110, where at least a portion of the upper surface portion and the side surface portion protrudes from one surface of the first insulating layer 110, and the metal layer 150 covering at least a portion of the protruding area of the pad 120 and the lower surface portion of the pad 120.

The first insulating layer 110 may include an insulating material. The insulating material may include a thermosetting resin such as an epoxy resin, a thermoplastic resin such as polyimide, or a material including an inorganic filler, an organic filler, and/or glass fiber (Glass Fiber, Glass Cloth, and/or Glass Fabric). The insulating material may be a photosensitive material and/or a non-photosensitive material. For example, the insulating material may be a Solder Resist (SR), an Ajinomoto Build-up Film (ABF), FR-4, a Bismaleimide Triazine (BT), a Prepreg (PPG), an insulating material of Resin Copper Copper (CCL), or the like, but may not be limited to other materials.

The pad 120 may be embedded in one side of the first insulating layer, where at least a portion of the upper surface portion and the side surface portion thereof may protrude from one side of the first insulating layer 110. However, the present disclosure is not limited thereto, and although not shown in FIG. 3, the pad 120 may have a structure in which only the upper surface portion is exposed to one surface of the first insulating layer 110 by being embedded in one surface of the first insulating layer 110. In this case, the protruding structure does not necessarily mean that all components of the pad 120 protrude from one surface of the first insulating layer 110, and may include a structure in which a part of the pad 120 is embedded in the first insulating layer 110 and another part protrudes. Meanwhile, the meaning that the pad 120 is embedded in one surface side of the first insulating layer 110 indicates the structure that the pad 120 is embedded in one surface of the first insulating layer 110, where at least a portion of the side surface portion of the pad 120 is covered by the first insulating layer 110, and at least another part of the side surface portion of the pad 120 is exposed from one side surface of the first insulating layer 110. Since the pad 120 may have a structure protruding from one surface of the first insulating layer 110, the upper surface portion of the pad 120 may be disposed above one surface of the first insulating layer 110, and the upper surface portion of the pad 120 may have a step difference from one surface of the first insulating layer 110. In order to have a structure in which the pad 120 is embedded from one surface of the first insulating layer 110, it may include a step of forming the pad 120 using a temporary carrier substrate, and then embedding the pad 120 with the first insulating layer 110 and removing the carrier substrate. Meanwhile, in order to have a structure in which the pad 120 protrudes from one surface of the first insulating layer 110, a process of removing a part of the first insulating layer 110 from one surface of the first insulating layer 110 may be performed after the step of removing the carrier substrate. In the step of removing a part of the first insulating layer 110, the pad 120 may not be removed so that only the first insulating layer 110 may be removed, and at least a portion of the side surface portion of the pad 120 may be exposed to one surface of the first insulating layer 110.

The pad 120 includes the metal materials. The metal materials may include copper (Cu), aluminum (Al), silver (Ag), tin (Sn), gold (Au), nickel (Ni), lead (Pb), titanium (Ti), and/or alloys thereof, and may preferably include copper (Cu), but the present disclosure is not limited to this. The pad 120 may be a pad on which electronic components and chips may be mounted, or may be a circuit pattern that connects signals with other pads, and may perform various functions depending on the design. The pad 120 may be formed of one of a Semi Additive Process (SAP), a Modified Semi Additive Process (MSAP), a Tenting (TT), and a sub-tracking method, but the present disclosure is not limited thereto. Meanwhile, although not shown in FIG. 3, the pad 120 may further include a seed layer according to a manufacturing method, but the present disclosure is not limited thereto, and the seed layer may be integrally formed with the pad or may be removed together in a carrier removal step during the manufacturing step.

Although FIG. 3 shows that one pad 120 is included to describe an area of one pad 120 in detail, the pad 120 of the printed circuit board according to one example may include a plurality of pads. The plurality of pads may be formed at the same time, but the pads are not limited thereto and may be formed in stages. In addition, the pads may electrically send and receive signals to circuits placed further on different layers, but some of the pads may be electrically short-circuited with other pads and other circuits to perform their functions. That is, the plurality of pads may perform different functions. Hereinafter, the described pad 120 describes one pad for convenience, but the plurality of pads may correspond to this.

In the present disclosure, the upper surface portion, the lower surface portion, and the side surface portion of the pad 120 may mean a large area of the upper surface, a large area of the lower surface, and a large area of the side surface, respectively. The upper surface portion of the pad 120 may refer to an upper surface of the pad 120, but the upper surface portion is not limited thereto, and may refer to a part including an area adjacent to the upper surface in consideration of the fact that the boundary between the upper surface and the side surface may be unclear as a part of the upper surface is removed. The lower surface portion of the pad 120 may refer to a lower surface of the pad 120, but the lower surface portion is not limited thereto, and may refer to a part including an area adjacent to the lower surface in consideration of the fact that the boundary between the lower surface and the side surface may be unclear as a part of the pad is removed. The side surface portion of the pad 120 may refer to a side surface of the pad 120, but the side surface art is not limited thereto, and may refer to a part including a side surface and an area adjacent to the side surface in consideration of the fact that the boundary between the side surface and the upper surface and the side surface may be unclear as a part of the pad is removed. In particular, since a part of the lower surface portion of the pad may be removed more than a part of the upper surface portion, the side surface portion may not be defined as a single surface and may have a shape in which the middle part protrudes convexly.

At least a portion of the side surface portion and at least a portion of the lower surface portion of the pad 120 may be spaced apart from the first insulating layer 110. After the pad 120 is formed on the first insulating layer 110, at least a portion of the side surface portion of the pad 120 and at least a portion of the lower surface portion of the pad 120 may be spaced apart from the first insulating layer 110. In this case, since the step of removing at least a portion of the pad 120 uses a process capable of selectively removing the pad 120, only a part of the pad 120 may be removed without removing the first insulating layer 110. The process of selectively removing the pad 120 may be, for example, a soft etching process, but the present disclosure is not limited thereto, and a portion of the side surface portion of the pad 120 may be removed first, and then an etching solution may be flowed along the removed side surface of the pad 120 to remove a portion of the lower surface portion. Meanwhile, the step of removing a part of the pad 120 may be used without limitation as long as it can remove only the pad 120 containing a metallic material without removing the first insulating layer 110 containing an insulating material.

An area in which the lower surface portion of the pad 120 extends to the side surface portion may have a curved surface. The curved surface is a concept that includes approximate things, which means that the boundary between the corners, where some two sides meet may not be clear. In other words, the fact that the area in which the lower surface portion extends to the side surface portion may have a curved surface means that the lower surface portion of the pad 120 and the side surface portion of the pad 120 may not have a separate boundary edge, and may be connected to include a round surface. Since the step of removing a part of the pad 120 uses an etching solution, the step of removing at least a part of the pad 120 may proceed without direction in the process of penetrating the etching solution and the process of exposing the pad 120. Accordingly, an area in which the lower surface portion of the pad 120 and the side surface portion of the pad 120 extend may have a curved surface.

The lower surface portion of the pad 120 may have a concave area. In order to increase the coupling force between the first via 130 and the pad 120, which will be described later, the pad 120 may have the concave area on the lower surface portion thereof. After the step of forming the pad 120, a step of removing at least a portion of the lower surface portion of the pad 120 may be included. The step of removing at least a portion of the lower surface portion of the pad 120 may be performed by a soft etching process, but the step is not limited thereto, and any process capable of removing a part of the pad may be used without limitation. In the case of using the soft etching process in the step of removing at least a portion of the lower surface portion of the pad 120, etching may proceed from the lower surface portion of the pad 120 toward the center of the pad 120. Due to the characteristics of soft etching, the lower surface portion of the pad 120 may have an oval or circular concave shape because it may proceed without directionality. This shape may have a recessed shape similar to that of a dimple on the lower surface portion of the pad 120, but the shape is not limited thereto. The dimple generated by the difference in the degree of plating in the process of forming the pad 120 and the concave portion formed through etching of the pad 120 are distinguished. The step of removing at least a portion of the pad 120 may be performed before the step of forming the first insulating layer 110 after the step of forming the pad 120. As will be described later, since the concave portion of the pad 120 may increase the connection area with the first via 130, the coupling force between the pad 120 and the first via 130 may be improved.

The width of the area of the first insulating layer 110 in which the pad 120 is formed may be expressed as a first length d1, the width of a side surface portion of the pad 120 may be expressed as a second length d2, the width of an upper surface portion of the pad may be expressed as a third length d3, the width the width of the area, where the lower surface portion of the pad 120 is in contact with the first insulating 110 may be expressed as a fourth length d4. In this case, the fourth length d4 may be shorter than the third length d3, the third length d3 may be shorter than the second length d2, and the second length d2 may be shorter than the first length d1.

In the present disclosure, the width is a concept including an approximate one, and may be interpreted as a horizontal distance crossing a certain configuration, but may include a measurement error or an error in a manufacturing process. For example, if a cross section of a configuration is circular, it may mean the diameter of the cross section, but the cross section is not limited thereto, and if the cross section is polygonal, it may mean the maximum distance among the distances between corners. For example, the first length d1, which is the width of an area of the first insulating layer 110 in which the pad 120 is formed, may mean a distance between the first insulating layers 110. The second length d2, which is the width of the side surface portion of the pad 120, may mean the diameter of the pad 120 on the cross section, considering the cross section of the pad 120 based on the extension surface of one surface of the first insulating layer 110. However, the present disclosure is not limited to this, and it may mean the diameter of the pad 120 on such a cross-section considering the cross-section of the pad 120 based on the virtual surface parallel to one surface of the first insulating layer 110. The third length d3, which is the width of the upper surface portion of the pad 120, may mean the diameter of the upper surface of the pad. The fourth length (d4), which is the width of the area, where the lower surface portion of the pad 120 and the first insulating layer 110 are in contact, may refer to the width of the area, where the first insulating layer 110 is in contact with the lower surface portion of the pad 120. That is, the fourth length d4 may mean the diameter of the lower surface of the pad 120.

In the present disclosure, the fact that a length may be shorter than any other length means that the size of the cross-sectional area constituting the length may be smaller than the size of the cross-sectional area constituting the other length. For example, the fourth length d4 may be shorter than the third length d3 is the same as the fact that the cross-sectional area of the area, where the lower surface portion of the pad 120 is in contact with the first insulating layer 110 may be smaller than the cross-sectional area of the upper surface portion of the pad 120.

The fact that the fourth length d4 may be shorter than the third length d3, and the third length d3 may be shorter than the second length d2, and thus, the fourth length d4 may be shorter than the second length d2. The fact that the fourth length d4 may be shorter than the second length d2 is the same as the fact that the cross-sectional area of the area, where the lower surface portion of the pad 120 is in contact with the first insulating layer 110 may be smaller than the cross-sectional area of the side surface portion of the pad 120. This means that in the step of removing a part of the pad 120, the lower surface portion of the pad 120 is removed more than the side surface portion of the pad 120. The cross-sectional area of the side surface portion of the pad 120 may mean the cross-sectional area of the pad 120 based on the extended surface of one surface of the first insulating layer 110, as in the case of measuring the second length d2.

The fact that the third length (d3) may be shorter than the second length (d2) means that the cross-sectional area of the upper surface portion of the pad 120 may be smaller than the cross-sectional area of the side surface portion of the pad 120. This is because in the step of removing a part of the pad 120, the upper surface portion of the pad 120 is removed more than the side surface portion of the pad 120. The upper surface portion of the pad 120 protrudes more than the side surface portion of the pad 120, and since the upper surface portion of the pad 120 is exposed to the pad 120 more than the side surface portion of the pad 120 in the removal step, the upper surface portion of the pad 120 may be removed more than the side surface portion of the pad 120. However, the present disclosure is not limited to this, and the degree to which the upper surface portion of the pad 120 is removed and the degree to which the side surface portion of the pad 120 is removed may be adjusted as necessary. For example, when the pad 120 is removed through etching, the environment may be changed by adjusting the degree of exposure of the pad 120 to the etching solution, or adjusting the sleep surface when the etching solution is applied.

The fact that the second length d2 may be shorter than the first length d1 is the same as the fact that the cross-sectional area of the side surface portion of the pad 120 may be smaller than the cross-sectional area of the area of the first insulating layer 110 in which the pad 120 is formed. This means that since one part of the pad 120 in the step after the pad 120 is embedded with the first insulating layer 110 is selectively removed, at least a portion of the side surface portion of the pad 120 is removed to remove at least a part of the lower surface portion of the pad 120. Therefore, since at least a portion of the side surface portion of the pad 120 is removed, the cross-sectional area of the side surface portion of the pad 120 may be smaller than the cross-sectional area of the first insulating layer 110 in which the pad 120 is formed. In addition, since at least a portion of the side surface portion of the pad 120 is removed, the side surface portion of the pad 120 may be spaced apart from the first insulating layer 110.

The printed circuit board according to one embodiment may include a metal layer 150. The metal layer 150 may cover at least a portion of the protruding area of the pad 120 and the lower surface portion of the pad 120. Furthermore, the metal layer 150 may fill an area spaced apart between at least a portion of the lower surface portion of the pad 120 and the first insulating layer 110, and an area spaced apart between at least a portion of the side surface portion of the pad 120 and the first insulating layer 110.

The metal layer 150 may include a metal material different from that of the pad 120. The metal layer 150 may include nickel (Ni), titanium (Ti), tin (Sn), aluminum (Al), silver (Ag), gold (Au), lead (Pb), and/or an alloy thereof, and may desirably include nickel (Ni), but the present disclosure is not limited thereto. The metal layer 150 may be formed by a plating process, and may be formed by a kind of process such as a process for forming the pad 120, but the present disclosure is not limited thereto.

The metal layer 150 is disposed between the pad 120 and the first insulating layer 110 to function as a means for maintaining the bonding force between the pad 120 and the first insulating layer 110. Since the pad 120 is formed such that at least a portion of the upper surface portion and the side surface portion of the pad 120 protrudes from one surface of the first insulating layer 110, the pad 120 and the first insulating layer 110 may be separated during a heat treatment and/or pressure treatment process in a process after the pad 120 is formed. Since the metal layer 150 may be disposed between the areas, where the pad 120 and the first insulating layer 110 are separated, the metal layer 150 may increase an area in contact with the pad 120 and the first insulating layer 110, thereby increasing the coupling force between the pad 120 and the first insulating layer 110.

In addition, although not shown in FIG. 3, the printed circuit board according to one embodiment may include an electronic component on the metal layer 150. The electronic component may be known an active component or a passive component, but this disclosure is not limited thereto, and other substrates, such as printed circuit boards including rewiring layers, may be mounted, and may be connected to interposers or bridges that connect substrates and chips. The metal layer 150 is disposed to cover the protruding area of the pad 120 so that physical and electrical coupling can be performed between the pad 120 and the electronic components disposed on the pad 120. The metal layer 150 is disposed between the pad 120 and the electronic component to facilitate coupling than when the pad 120 and the electronic component are directly connected. Meanwhile, since the metal layer 150 may be disposed to fill an area spaced between the lower surface portion of the pad 120 and the first insulating layer 110, the contact area between the metal layer 150 and the pad 120 can be increased, and the coupling force between the metal layer 150 and the pad 120 may be excellent. Since the bonding between the metal layer 150 and the pad 120 is excellent, it is possible to prevent problems that may occur in the pad 120 in the stage of mounting electronic components on the pad 120.

The metal layer 150 may cover the protruding area of the pad 120. The protruding area of the pad 120 refers to an area in which the pad 120 protrudes from the first insulating layer 110, and may correspond to an area in which at least a part of the upper surface portion of the pad 120 and the side surface portion of the pad protrude. The metal layer 150 may be disposed on at least a portion of the upper surface portion of the pad 120 and one surface portion of the pad 120 to cover the pad 120. Furthermore, the metal layer 150 may fill the area spaced apart between at least a portion of the side surface portion of the pad 120 and the first insulating layer 110, and the metal layer 150 may fill a spaced area between at least a portion of the lower surface portion of the pad 120 and the first insulating layer 110, as described above.

The printed circuit board according to one embodiment may further include a first circuit 140 disposed on the other surface facing one surface of the first insulating layer 110 and a first via 130 penetrating the first insulation layer 110 to connect the first circuit 140 and the pad 120.

The first circuit 140 includes a metallic material. The first circuit 140 may include the same metal material as the pad 120, but the present disclosure is not limited thereto. The first circuit 140 may be disposed on the other surface facing one surface of the first insulating layer 110, and may be a circuit pattern that performs a signal connection between the pad 120 and another circuit, and may perform various functions according to the design. The first circuit 140 may be formed of any one of a Semi Additive Process (SAP), a Modified Semi Additive Process (MSAP), a Tenting (TT), and a sub-tracking method, but the present disclosure is not limited thereto. In FIG. 3, it is expressed that one first circuit 140 is included to describe the area of one first circuit 140 in detail, but the expression is the same as the fact that the first circuit 140 of the printed circuit board according to one embodiment may be composed of a plurality of circuits, the pad 120 may be composed of a plurality of pads.

The thickness of the first circuit 140 may be less than the thickness of the pad 120. The thickness of a configuration may be interpreted as a longitudinal crossing distance of a configuration, but may include a measurement error or an error in the manufacturing process. That is, the thickness of the pad 120 may mean the longest vertical distance between the upper and lower surfaces of the pad 120, and this meaning may also be applied to the thickness of the first circuit 140. The pad 120 has a configuration protruding from one surface of the first insulating layer 110, and may be thicker than other circuits of the printed circuit board, because the pad is connected to electronic component mounted on one surface of the first insulating layer 110. However, the present disclosure is not limited thereto, and the thickness of the pad 120 may be adjusted as necessary, and thus, the pad 120 may be formed at substantially the same level as the thickness of the first circuit 140.

The first via 130 may pass through the first insulating layer 110 to connect the lower surface portion of the pad 120 to the first circuit 140. The first via 130 may include a metal material and may include the same metal material as the first circuit 140, but the present disclosure is not limited thereto. The first via 130 may be simultaneously formed in the step of forming the first circuit 140 to form an integral body between the first via 130 and the first circuit 140, but the present disclosure is not limited thereto, and after the first via 130 is first formed, the first circuit 140 may be formed through a separate process.

The first via 130 includes a first portion 131 filling a concave area formed on the lower surface portion of the pad 120 and a second portion 132 penetrating the first insulating layer 110 to connect the first portion 131 and the first circuit 140. The first portion 131 and the second portion 132 may be formed at the same time, and are separated for convenience to clearly understand the structure of the first via 130. The first portion 131 refers to the area of the first via 130 filling the concave area of the lower surface portion of the pad 120 from the lower surface portion of the pad 120 to the center of the pad 120, and the second portion 132 refers to the area of the first via 130 filling the through hole area passing through the first insulating layer 110 from the lower surface portion of the pad 120 in the outer direction of the pad 120.

The width of the first portion 131 at the lower surface portion of the pad 120, which is the boundary, where the first portion 131 and the second portion are extended, may be expressed as the fifth length d5, and the width of the second portion 132 at the same position as the sixth length d6. In this case, the fifth length d5 may be greater than the sixth length d6. This means that the width of the first portion 131 filling the concave area formed on the lower surface portion of the pad 120 may be greater than the width of the second portion 132 filling the through hole area passing through the first insulating layer 110. This is because the width of the through hole is narrower than the width of the concave area in the step of forming the first insulating layer 110 and penetrating the first insulating layer 110 after forming a concave area on the lower surface portion of the pad 120.

The fact that the fifth length d5 may be greater than the sixth length d6 is the same as the fact that the cross-sectional area of the first portion 131 is larger than the cross-sectional area of the second portion 132 at the lower surface portion of the pad 120, which is the boundary where the first portion 131 and the second portion are extended. This is because the concave area of the pad 120 is formed so that the cross-sectional area of the concave area at the lower surface portion of the pad 120 is larger than the cross-sectional area of the through-hole area at the lower surface portion of the pad 120. Accordingly, the first via 130 may have an anchor shape in which the first portion 131 and the second portion 132 are integrally connected. It is preferable that the second portion 132 is disposed at the center of the first portion 131, but the present disclosure is not limited thereto and may be formed by being biased from the center to the left or right. By making the cross-sectional area of the first portion 131 larger than the cross-sectional area of the second portion 132, the coupling area between the first via 130 and the pad 120 may be increased. In particular, since the first via 130 may have the anchor shape, the coupling force between the pad 120 and the first via 130 may be increased by the first portion 131 filling the concave area of the pad 120, and the coupling force between the first via 130 and the first insulating layer may be excellent. Therefore, even if other processes of the printed circuit board are performed, defects may not occur between the pad 120 and the first via 130 under thermal or pressure conditions.

Meanwhile, the fifth length d5 may be substantially the same as the sixth length d6. In this case, the cross-sectional area of the first portion 131 may be substantially the same as the cross-sectional area of the second portion 132 at the lower surface portion of the pad 120, which is the boundary where the first portion 131 and the second portion are extended. This means that the cross-sectional area of the concave area of the pad 120 and the cross-sectional area of the through-hole area for the first via 130 may be formed to be substantially the same. Even in this case, the contact area between the pad 120 and the first via 130 may be larger than the case where the concave area is not formed in the pad 120 as described above.

In addition, the first via 130 may further include a seed layer 133 disposed along a boundary of the first portion 131 and a boundary of the second portion 132. The seed layer 133 may include, but the present disclosure is not limited to, a metal material such as the first via 130. The seed layer 133 may be formed through an electroless plating process, and may then function as a plating seed in the plating step of the first via 130. After the concave area is formed in the pad 120, the first insulating layer 110 is formed, the through hole penetrating the first insulating layer 110, and the seed layer 133 is formed, the seed layer 133 may be formed along the boundary of the first via. Meanwhile, referring to FIG. 3, the seed layer 133 may extend to the other surface of the first insulating layer 110 and may be disposed at a boundary between the first circuit 140 and the first insulating layer 110.

The printed circuit board according to one embodiment may further include an insulation layer and a circuit disposed on the other surface of the first insulation layer 110, and may further include vias connecting circuits. In addition, it is not limited to the configuration illustrated in FIG. 3, and may further include a general configuration of the printed circuit board such as another insulation layer, another circuit pattern, a penetration via, and a solder resist disposed on one side of the first insulation layer 110. That is, it may further include a configuration that may be used by a person skilled in the art.

Meanwhile, in the printed circuit board according to one embodiment, an upper surface of the metal layer may be exposed to the outside. Even if the general configuration is further included in the printed circuit board according to one embodiment, the pad 120 may be disposed on the outermost layer of the printed circuit board, and the metal layer 150 disposed on the pad 120 may be exposed to the outside of the printed circuit board. As the metal layer 150 is exposed to the outside, the electronic component may be mounted on the printed circuit board according to one embodiment. Meanwhile, at least a portion of one surface of the first insulating layer 110 may be exposed to the outside of the printed circuit board according to one embodiment. This means that the first insulating layer 110 embedded in the pad 120 may be disposed on the outermost layer of the printed circuit board, and even if a solder resist layer is disposed on one surface of the first insulating layer 110, a part of one surface of the first insulating layer 110 may be exposed to the outside. When the electronic component is coupled to the pad 120 of the printed circuit board, it may be connected through a connection member, and in this case, the metal layer 150 may not be exposed to the outside, but the connection member and electronic component are not considered as a configuration of the printed circuit board, and it can be interpreted that the metal layer is still exposed to the outside of the printed circuit board, and at least a portion of the first insulating layer 110 is exposed to the outside of the printed circuit board.

Figure 4:
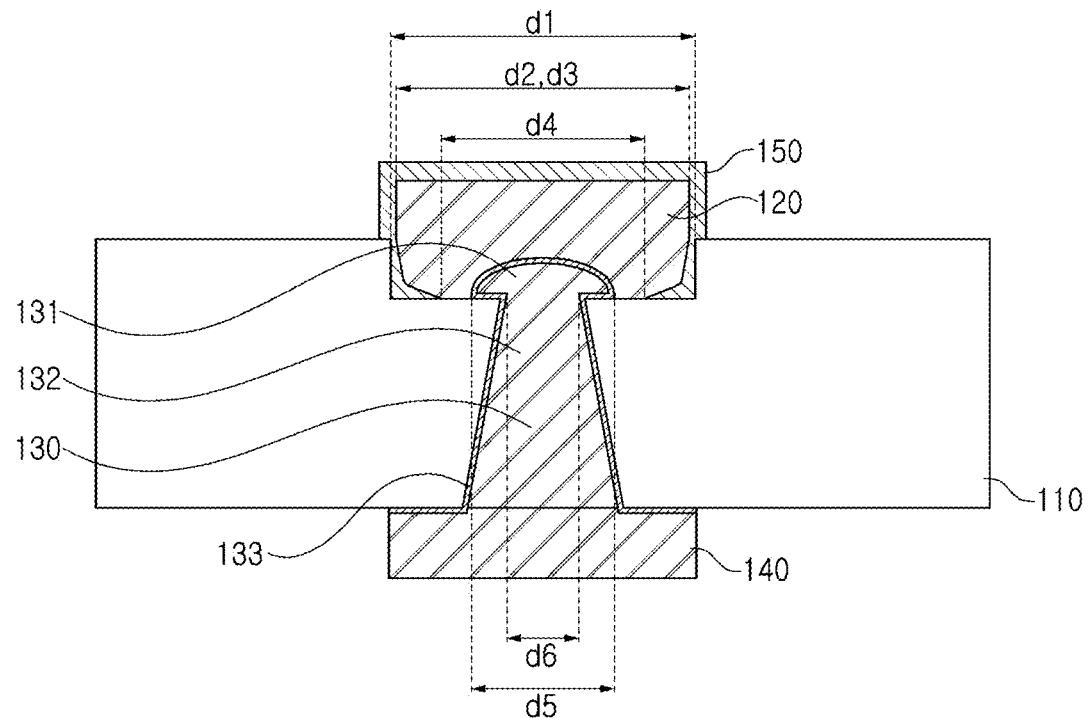
FIG. 4 is a cross-sectional view schematically illustrating the printed circuit board according to the other embodiment.

FIG. 4 is a cross-sectional view schematically illustrating a printed circuit board according to another example.

Referring to FIG. 4, the printed circuit board according to another example may have substantially the same length d2 and the third length d3. Substantially the same is a concept including an approximate one, and means that it may be determined including, for example, a process error, a position deviation, an error during measurement, and the like occurring in a manufacturing process. That is, the width of the upper surface portion of the pad 120 may be substantially the same as the width of the side surface portion of the pad 120. In the step of removing at least a portion of the pad 120, this corresponds to the result of maintaining the degree to which the upper surface portion of the pad 120 is removed and the degree to which the lower surface portion of the pad 120 is removed to substantially the same degree. The fact that the second length d2 and the third length d3 are substantially the same means that the cross-sectional area of the upper surface portion of the pad 120 is substantially the same as the cross-sectional area of the side surface portion of the pad 120.

Among the configurations other than the relationship between the upper surface portion of the pad 120 and the lower surface portion of the pad 120, the same configuration as the printed circuit board according to one embodiment can be applied to the printed circuit board according to another example, and thus, a redundant description thereof will be omitted.

Figure 5:
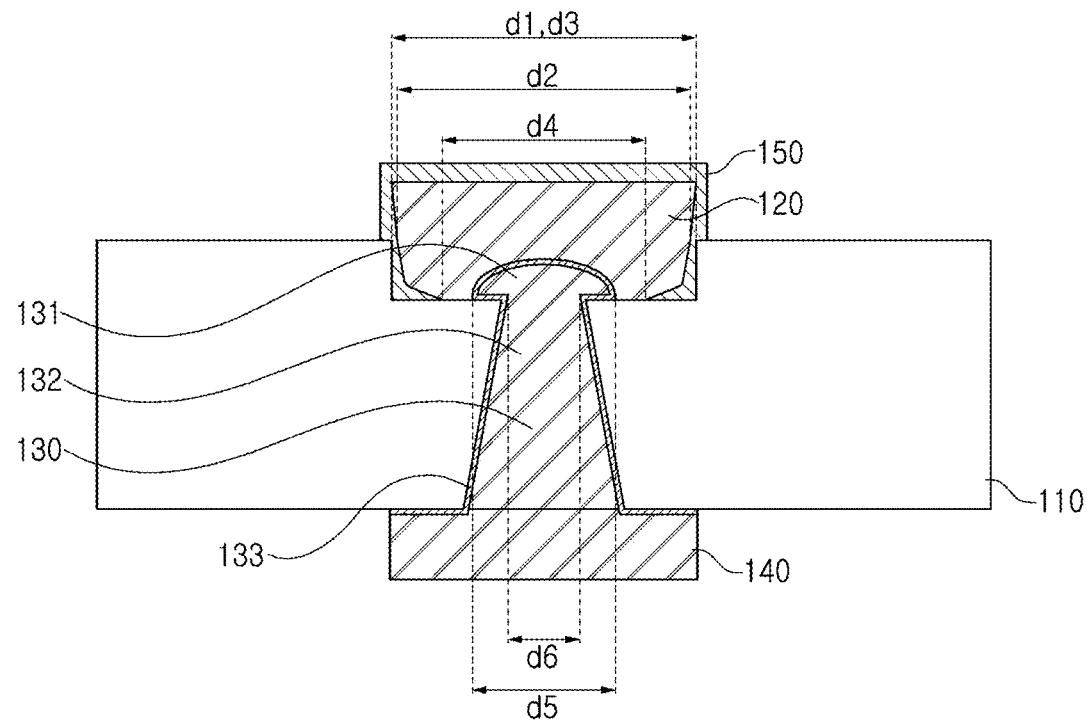
FIG. 5 is a cross-sectional view schematically illustrating the printed circuit board according to another example.

FIG. 5 is a cross-sectional view schematically illustrating a printed circuit board according to one embodiment.

Referring to FIG. 5, the printed circuit board according to another example may have substantially the same length d1 and a third length d3. That is, the width of the area of the first insulating layer 110 in which the pad 120 is formed may be substantially the same as the width of the upper surface portion of the pad 120. This means that in the step of removing at least a portion of the pad 120, only the side and bottom portions of the pad 120 are removed without removing the upper surface portion of the pad 120. As the upper surface portion of the pad 120 is not removed, the width of the area where the pad 120 of the first insulating layer 110 is formed and the width of the upper surface portion of the pad 120 can be maintained without any change even after the pad removal step. The fact that the first length d1 and the third length d3 are substantially the same means that the cross-sectional area of the area where the pad 120 of the first insulating layer 110 is formed is substantially the same as the cross-sectional area of the upper surface portion of the pad 120.

The fact that the second length d2 may be shorter than the first length d1 is the same as the printed circuit board according to one embodiment, and as the first length d1 may be substantially the same as the third length d3, the second length d2 may be shorter than the third length d3. As described above, in the step of removing at least a portion of the pad 120, the upper surface portion of the pad 120 is not removed, and the conditions are set to remove only the side and lower surface portions of the pad, the width of the side surface portion of the pad 120 may be smaller than the width of the upper surface portion of the pad 120. In addition, this has the same meaning as that the cross-sectional area of the side surface portion of the pad 120 is smaller than the cross-sectional area of the upper surface portion of the pad 120.

Among the configurations other than the upper surface portion of the pad 120, the same configuration as the printed circuit board according to one embodiment and the printed circuit board according to another embodiment can also be applied, and thus, a redundant description thereof will be omitted.

Figure 6:
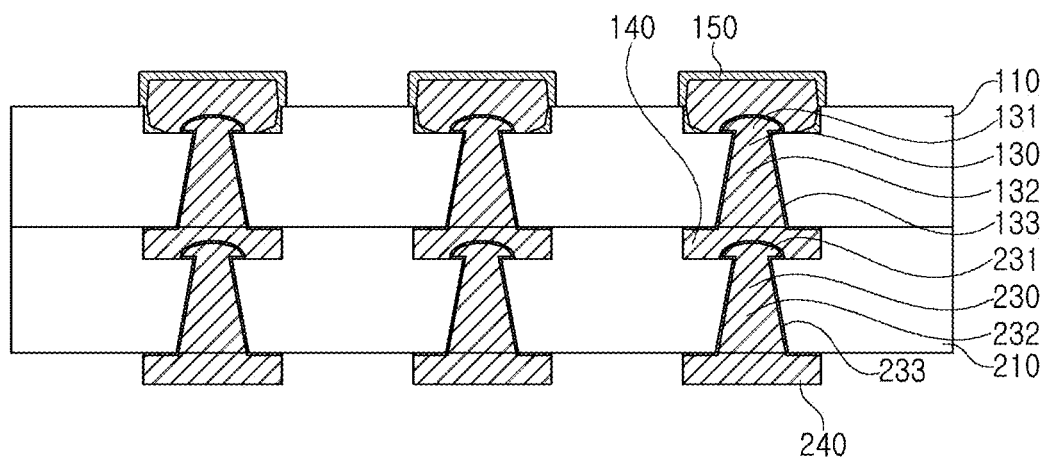
FIG. 6 is a cross-sectional view schematically illustrating the printed circuit board according to another embodiment.

FIG. 6 is a cross-sectional view schematically illustrating a printed circuit board according to another example.

Referring to FIG. 6, the printed circuit board in accordance with another example can further contain a second insulating layer 210, a second circuit 240, and a second via 230.

The second insulating layer 210 may be disposed on the other surface of the first insulating layer, and may include an insulating material such as the first insulating layer, but the present disclosure is not limited thereto. The second circuit 240 may be disposed on one surface of the second insulating layer 210 and may include a metal material such as the first circuit 140. The second via 230 may penetrate the second insulating layer 210 to connect the first circuit 140 and the second circuit 240, and the second via 230 may be formed at the same time as the second circuit 240, but the present disclosure is not limited thereto. The second insulating layer 210, the second circuit 240, and the second via 230 may have the same characteristics as those of the first insulating layer 110, the first circuit 140, and the first via 130.

Meanwhile, the first circuit 140 may have a concave area like the pad 120, and the second via 230 may have a first portion 231 and a second are 232. The concave area of the first circuit 140 and the first portion 231 and the second portion 232 of the second via 230 have the same configuration and shape as the concave area of the pad 120 and the first portion 131 and the second portion 132 of the first via 130, respectively, and may have the same effect. That is, the structural features and effects of the first via 130 of the printed circuit board according to one embodiment are not limited to the pad 120, but can be applied between other interlayer vias and circuit layers.

Meanwhile, the same configuration as the printed circuit board according to an example among the configurations other than the concave areas of the second insulating layer 210, the second circuit 240, the second via 230, and the first circuit 140 may be applied to the printed circuit board according to another embodiment, and thus, a redundant description thereof will be omitted.

On the other hand, the printed circuit board according to another embodiment of FIG. 6 is described based on the printed circuit board according to another embodiment of FIG. 3, but the present disclosure is not limited thereto, and may further include a configuration based on the printed circuit board according to another embodiment of FIG. 5.

In the present disclosure, the meaning on the cross-section may mean a cross-sectional shape when an object is vertically cut, or a cross-sectional shape when the object is viewed as a side-view. Furthermore, the meaning on the plane may be a shape when the object is cut horizontally, or a planar shape when the object is viewed as a top-view or bottom-view.

In the present disclosure, an upper side, an upper part, and an upper surface are used to refer to a direction toward a surface on which an electronic component may be mounted based on a cross section of the drawings, and a lower side, a lower part, and a lower surface are used in a direction opposite to each other. However, this defines the direction for convenience of explanation, and it goes without saying that the scope of the patent claim is not particularly limited by the description of this direction.

In the present disclosure, the meaning of being connected is a concept that includes not only directly connected, but also indirectly connected through an adhesive layer or the like. Also, the meaning of being electrically connected is a concept that includes both physically connected and not connected. Also, the expressions such as first and second are used to distinguish one component from another, and do not limit the order and/or importance of the components. In some cases, without going beyond the scope of rights, the first component may be named as the second component, and similarly, the second component may be named as the first component.

The expression "embodiment" used in this disclosure does not mean the same embodiment, and is provided to emphasize and explain different unique features. However, it is not excluded that the embodiments presented above are implemented in combination with the features of another embodiment. For example, even if a matter described in a particular example is not explained in another embodiment, it can be understood as an explanation relating to another embodiment, unless there is an explanation opposite or contradictory to that point in another embodiment.

The terms used in this disclosure are used only to describe an embodiment, and are not intended to limit this disclosure. In this case, singular expressions include multiple expressions, unless the context clearly means otherwise.

DESCRIPTION OF THE LABELS

| | |
|---|---|
| 110: FIRST INSULATING LAYER | 210: SECOND INSULATING LAYER |
| 120: PAD | |
| 130: FIRST VIA | 230: SECOND VIA |
| 131, 231: FIRST PORTIONS | 132, 232: SECOND PORTIONS |
| 133: SEED LAYER | |
| 140: FIRST CIRCUIT | 240: SECOND CIRCUIT |
| 150: METAL LAYER | |
| D1: FIRTH LENGTH | D2: SECOND LENGTH |
| D3: THIRD LENGTH | D4: FOURTH LENGTH |
| D5: FIFTH LENGTH | D6: SIXTH LENGTH |
| 1000: ELECTRONICS | 1010: MOTHERBOARD |
| 1020: CHIP-RELATED COMPONENTS | |
| 1030: NETWORK-RELATED COMPONENTS | |
| 1040: OTHER COMPONENTS | |
| 1050: CAMERA MODULE | |
| 1060: ANTENNA MODULE | 1070: DISPLAY |
| 1080: BATTERY | 1090: SIGNAL LINE |
| 1100: SMARTPHONE | |
| 1110: SMARTPHONE INTERNAL MOTHERBOARD | |
| 1120: SMARTPHONE INTERNAL ELECTRONIC COMPONENTS | |
| 1121: SMARTPHONE INTERNAL ANTENNA MODULE | |
| 1130: SMARTPHONE INTERNAL CAMERA MODULE | |
| 1140: SMARTPHONE INTERNAL SPEAKER | |

What is claimed is:

1. A printed circuit board, comprising:
a first insulating layer including a recess;
a pad arranged in the recess so as to be embedded in an upper portion of the first insulating layer and having an upper surface portion, a side surface portion, and a lower surface portion, where a portion of the upper surface portion and a portion of the side surface portion protrude from an upper surface of the first insulating layer; and
a metal layer covering the portion of the upper surface portion, the portion of the side surface portion, and a portion of the lower surface portion of the pad,
wherein at least a portion of the metal layer is arranged in the recess.

2. The printed circuit board of claim 1,
wherein the portion of the lower surface portion of the pad is spaced apart from the first insulating layer, and the metal layer fills an area by which the portion of the lower surface portion of the pad and the first insulating layer are separated.

3. The printed circuit board of claim 2, wherein a cross-sectional area of an area in which the lower surface portion of the pad is in contact with the first insulating layer is smaller than a cross-sectional area of the side surface portion of the pad.

4. The printed circuit board of claim 3, wherein a cross-sectional area of the upper surface portion of the pad is smaller than the cross-sectional area of the side surface portion of the pad.

5. The printed circuit board of claim 3, wherein the cross-sectional area of the upper surface portion of the pad is substantially the same as the cross-sectional area of the side surface portion of the pad.

6. The printed circuit board of claim 3, wherein the cross-sectional area of the side surface portion of the pad is smaller than a cross-sectional area of the upper surface portion of the pad.

7. The printed circuit board of claim 1, wherein an area in which the lower surface portion of the pad extends to the side surface portion of the pad has a curved surface.

8. The printed circuit board of claim 1, wherein the upper surface of the metal layer is exposed to outside.

9. The printed circuit board of claim 1, wherein the upper surface of the pad has a step difference from upper surface of the first insulating layer.

10. The printed circuit board of claim 1, wherein the metal layer includes a metal different from a metal included in the pad.

11. The printed circuit board of claim 1, further comprising:
a first circuit disposed on the lower surface of the first insulating layer; and
a first via penetrating the first insulating layer to connect the first circuit and the pad,
wherein the thickness of the pad is thicker than the thickness of the first circuit.

12. The printed circuit board of claim 11, wherein the lower surface portion of the pad has a concave area.

13. The printed circuit board of claim 12,
wherein the first via has a first portion filling the concave area of the lower surface portion of the pad and a second portion penetrating the first insulating layer, and
a cross-sectional area of the first portion at a boundary between the first portion and the second portion is greater than a cross-sectional area of the second portion at the boundary between the first portion and the second portion.

14. The printed circuit board of claim 13, wherein the first via further comprises a seed layer disposed along an outer boundary of the first portion and an outer boundary of the second portion.

15. A printed circuit board, comprising:
a first insulating layer;
a pad embedded in one surface side of the first insulating layer, and including one surface exposed from one surface of the first insulating layer and another surface having a concave area; and
a first via having a first portion filling the concave area of the another surface of the pad and a second portion penetrating the first insulating layer,
wherein at least a portion of the one surface of the first insulating layer is exposed to outside, and
on the another surface of the pad, a width of the first portion is larger than a width of the second portion.

16. The printed circuit board of claim 15, wherein the first via further comprises a seed layer disposed along an outer boundary of the first portion and an outer boundary of the second portion.

17. The printed circuit board of claim 15, further comprising
a first circuit disposed on another surface of the first insulating layer,
wherein the first via connects the pad and the first circuit to each other.

18. The printed circuit board of claim 17, further comprising:
a second insulating layer stacked below the first insulating layer and having the first circuit embedded therein;
a second circuit disposed on an outer surface of the second insulating layer opposing a surface on which the first circuit is disposed;
a second via penetrating the second insulating layer and connecting the first and second circuits.

19. The printed circuit board of claim 18, wherein one surface of the first circuit embedded in the second insulating layer has a concave area, and
the second via has a first portion filling the concave area of the first circuit and a second portion penetrating the second insulating layer.

20. The printed circuit board of claim 19, wherein
on the one surface of the first circuit, a cross-sectional area of the first portion is larger than a cross-sectional area of the second portion.

* * * * *